United States Patent
Lee et al.

(10) Patent No.: US 7,541,664 B2
(45) Date of Patent: Jun. 2, 2009

(54) LEAD FRAME AND SEMICONDUCTOR DEVICE HAVING THE LEAD FRAME

(75) Inventors: Soo-bong Lee, Yongin-si (KR); Jung-Do Kim, Yongin-si (KR); Woo-suk Choi, Yongin-si (KR); Eun-hee Kim, Yongin-si (KR)

(73) Assignee: Samsung Techwin Co., Ltd. (KR)

( * ) Notice: Subject to any disclaimer, the term of this patent is extended or adjusted under 35 U.S.C. 154(b) by 353 days.

(21) Appl. No.: 11/134,138

(22) Filed: May 20, 2005

(65) Prior Publication Data

US 2006/0049493 A1 Mar. 9, 2006

(30) Foreign Application Priority Data

Sep. 4, 2004 (KR) ...................... 10-2004-0070614

(51) Int. Cl.
*H01L 23/495* (2006.01)
(52) U.S. Cl. ............... 257/666; 257/787; 257/E23.031; 257/E23.043; 257/E23.052
(58) Field of Classification Search ................. 257/666, 257/670, 672, 787, E23.031, E23.043, E23.052
See application file for complete search history.

(56) References Cited

U.S. PATENT DOCUMENTS

| | | | |
|---|---|---|---|
| 5,437,915 A | 8/1995 | Nishimura et al. .......... 428/209 |
| 5,535,509 A | 7/1996 | Tomita et al. ................. 29/827 |
| 5,571,428 A | 11/1996 | Nishimura et al. ..... 219/121.64 |
| 5,724,726 A | 3/1998 | Tomita et al. ................. 29/827 |
| 5,763,829 A | 6/1998 | Tomita et al. .............. 174/52.2 |
| 6,518,508 B2 | 2/2003 | Park et al. .................... 174/255 |
| 2002/0053721 A1 * | 5/2002 | Kubara et al. ............... 257/666 |

FOREIGN PATENT DOCUMENTS

| | | |
|---|---|---|
| JP | 5-190720 | 7/1993 |
| JP | 5-343445 | 12/1993 |

* cited by examiner

*Primary Examiner*—Hoai v Pham
(74) *Attorney, Agent, or Firm*—Park & Associates IP Law LLC

(57) ABSTRACT

Provided is a lead frame having an improved wire bonding property of inner leads and an improved soldering property of outer leads and preventing defects with high producing yield, and a method of manufacturing the lead frame. The lead frame includes a plurality of inner leads formed with predetermined intervals between them; and a plurality of outer leads extended from the inner leads in length directions of the inner leads, each of which has an end portion overlapped with the inner lead and coupled thereto and the other end connected to neighboring outer lead by a supporting portion.

14 Claims, 9 Drawing Sheets

LEAD FRAME AND SEMICONDUCTOR DEVICE HAVING THE LEAD FRAME

This application claims priority of Korean Patent Application No. 10-2004-0070614, filed on Sep. 4, 2004, in the Korean Intellectual Property Office, the disclosure of which is incorporated herein in its entirety by reference.

FIELD OF THE INVENTION

The present invention relates to a semiconductor device and a lead frame for the semiconductor device, and a method of manufacturing the lead frame and the semiconductor device.

DESCRIPTION OF THE RELATED ART

A lead frame is an element of a semiconductor device, which supports a semiconductor chip thereon and electrically connects the semiconductor chip to an external circuit such as a circuit board. FIG. 1 shows a lead frame 10 according to a conventional art. The lead frame 10 includes a die pad 11 and leads 15 arranged about the die pad 11. The die pad 11 is typically disposed at a central location of the lead frame 10 and connected to an outer frame or side rail member 18 by tie bars 12. The leads 15 include inner leads 13 and outer leads 16, and a dam bar 17 is formed between inner leads 13 and outer leads 16 while supporting the leads to maintain a designed shape. The outer frame 18 and dam bar 17 are to be removed after the semiconductor packaging is completed. The lead frame 10 is formed typically by a stamping or an etching process.

FIG. 2 illustrates a structure of a semiconductor device 20 having a semiconductor chip 50 mounted on a lead frame such as shown in FIG. 1. According to a known semiconductor package process, the semiconductor chip 50 is attached on the die pad 11 using an adhesive 51, the inner leads 13 and corresponding bonding pads (electrodes) 52 of the semiconductor chip 50 are wire-bonded by a wire 60, and the outer leads 16 are electrically connected to the external circuit. The semiconductor chip 50 and the inner leads 13 are molded by a mold resin 70 to form the semiconductor package 20.

In order to improve the wire bonding capability between the semiconductor chip 50 and the inner leads 13, a silver (Ag) plating layer 14 is typically applied on an end portion of the each of the inner leads 13. In addition, in order to improve the soldering attachment between the external circuit (not shown) and the outer leads 16, a tin (Sn) plating layer 19 is applied on an outer region of the outer lead 16 after the semiconductor packaging is performed with the resin mold material. However, this process should be performed through a wet process after the resin molding process, which is often a troublesome process and may result in reduction of the product qualities and reliabilities.

In order to solve the problems discussed above, it has been suggested to use a pre-plated frame (PPF). This pre-plating method is typically performed by pre-plating a material having good solder wettability onto a surface of the lead frame. U.S. Pat. No. 6,518,508 assigned to the coassignee of present application discloses an example of the PPF. In this example, Ni plating layer, Pd plating layer, and Ag plating layer are sequentially formed on a base material for the lead frame. The PPF method may be advantageous in that one plating process can prepare the lead frame for both wire-bonding and connecting the lead frame to the external circuit. However, the cost of manufacturing the lead frame becomes relatively high because noble metals are used in the process, and cracks may be easily generated during a subsequent bending of the leads (to form a desired shape requiring in the manufacturing process) due to a so-called Galvanic corrosion effect particularly in the case where the base lead frame is formed of Fe—Ni alloy.

In order to solve these problems, it has been suggested to use a two-tone pre-plated frame, in which two different kinds of metal are plated one on the inner lead portions and the other on the outer lead portions of the base lead frame. In the two-tone pre-plated frame method, for example, silver (Ag) is plated on the portion of the base frame corresponding to the inner leads and tin (Sn) is plated on the portion of the base frame corresponding to the outer leads. This method can be effectively applied when the alloy of Fe—Ni is used for the base frame material. As such, the two-tone pre-plated frame method may be advantageous because of its applicability to different base materials, low costs of material, and enhanced quality of assembly. However, in the two-tone pre-plated frame process, a whisker is often generated regardless of the plating solution condition or the plating time. Due to this whisker phenomenon, the lead frame may be short-circuited. In order to remove the whisker, a reflow process is typically performed, in which the lead frame with the tin (Sn) plating layer disposed thereon is subjected to heat at a temperature higher than a re-crystallization temperature. In this case, however, the entire processing time increases, and as a result, the productivity becomes lowered and manufacturing costs increase by the additional processes required therein. In addition, the Ag plating layer formed on the inner leads becomes easily damaged by the heat in the reflow process, which causes degradation of bonding quality between the bonding wire and the inner leads.

SUMMARY OF THE INVENTION

The present invention provides a lead frame having an improved wire-bonding of inner leads and an improved soldering of outer leads, and a method of manufacturing the lead frame. The present invention also provides a lead frame having an improved yield and reduced defects, and a method of manufacturing the lead frame. The present invention also provides a lead frame having an improved mechanical strength and workability of manufacturing processes thereof, and a method of manufacturing the lead frame.

The present invention further provides a method of forming a semiconductor device, and the semiconductor device formed with the lead frame of the invention.

According to one aspect of the present invention, a lead frame for a semiconductor device comprises: a plurality of inner leads arranged in an inward direction of the lead frame with predetermined intervals between them; and a plurality of outer leads, each of the outer leads extending outwardly from a corresponding one of the inner leads, each of the outer leads having an inner end overlapped and connected with the corresponding one of the inner leads and an outer end connected to a supporting portion disposed at an outer area of the outer leads.

The lead frame preferably includes a dam bar formed along the outer leads in a transverse direction thereof and connecting the outer leads to one another, and a die pad disposed at an inward location from the inner leads. The inner leads of the lead frame preferably includes a first plating layer formed on an inner surface of the inner leads, wherein the first plating layer contains at least one material selected from a group consisting of Ag, Au and Pd. The outer leads of the lead frame preferably include a second plating layer formed thereon, wherein the second plating layer contains Sn as a main material. The overlapped portions of the inner leads and the outer leads can be connected together by welding, bonding, or other metal connection methods.

According to another aspect of the present invention, a method of producing a lead frame comprises: providing a first lead frame; forming the first lead frame into a predetermined shape, the shape including a plurality of inner leads and a first coupling portion disposed around the inner leads; forming a first plating layer at least on some surface area of the inner leads, the first plating layer containing at least one material selected from Ag, Au and Pd; providing a second lead frame; forming the second lead frame into a predetermined shape, the shape including a plurality of outer leads and a second coupling portion disposed around the outer leads; forming a second plating layer at least on some surface area of the outer leads, the second plating layer containing Sn as a main material; heat treating the second plating layer at a temperature higher than a re-crystallization temperature of the second plating layer; and coupling the first and second lead frames with the first and second coupling portions of the first and second lead frames joined together.

The method of producing a lead frame preferably includes a further step of removing predetermined portions of the first and second coupling portions for separating connection between each lead of the lead frame, which is performed after coupling the first and second lead frames.

According to another aspect of the present invention, a semiconductor device comprises: a lead frame, the lead frame including a plurality of inner leads arranged in an inward direction of the lead frame, and a plurality of outer leads each of the outer leads extending outwardly from a corresponding one of the inner leads, each of the outer leads having one end portion overlapped and connected with the corresponding one of the inner leads; a semiconductor chip disposed adjacent to a central location of the lead frame in a manner supported by the lead frame; and an encapsulation material covering at least some portions of the semiconductor chip and the lead frame including the overlapped portion of the inner and outer leads.

According to another aspect of the present invention, a method of producing a semiconductor device comprises: forming a lead frame, the lead frame including a plurality of inner leads arranged in an inward direction of the lead frame, and a plurality of outer leads each of the outer leads extending outwardly from a corresponding one of the inner leads, each of the outer leads having an inner end overlapped and connected with the corresponding one of the inner leads and an outer end connected to an outer supporting structure of the lead frame; mounting a semiconductor chip to the lead frame in a manner supported by the lead frame; encapsulating at least some portions of the semiconductor chip and the lead frame with an encapsulation material except at least the outer supporting structure of the lead frame; and removing at least some of the outer supporting structure of the lead frame to separate the leads of the lead frame with one another.

The encapsulating of the semiconductor device is performed in a manner preferably covering the overlapped portion of the inner and outer leads of the lead frame.

BRIEF DESCRIPTION OF DRAWINGS

The above and other features and advantages of the present invention will become more apparent by describing in detail exemplary embodiments thereof with reference to the attached drawings in which.

DETAILED DESCRIPTION OF PREFERRED EMBODIMENTS

Figure 1:
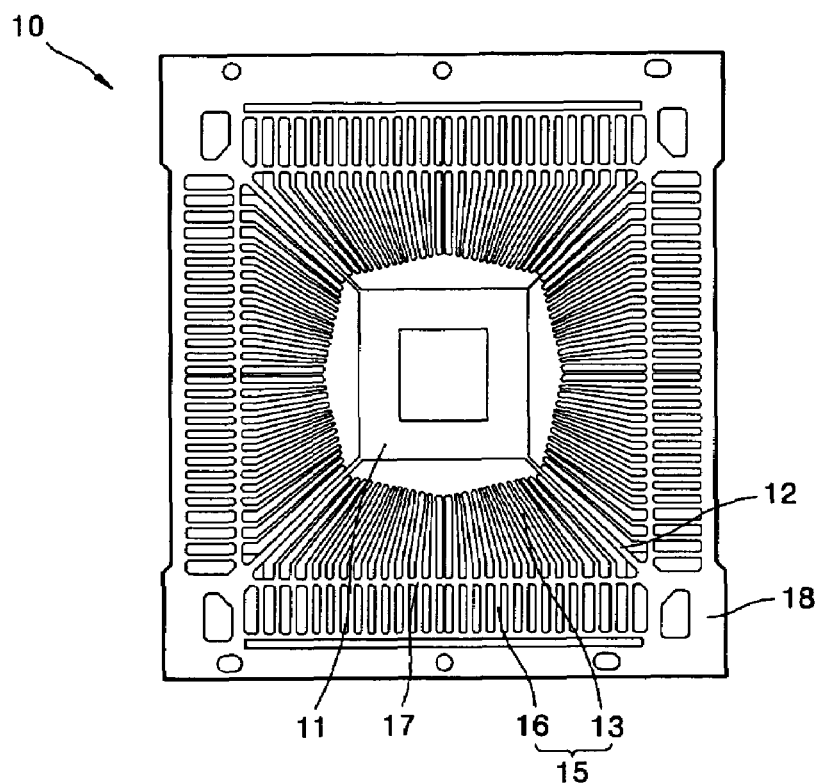
FIG. 1 is a plan view of a lead frame according to a conventional art.
Figure 2:
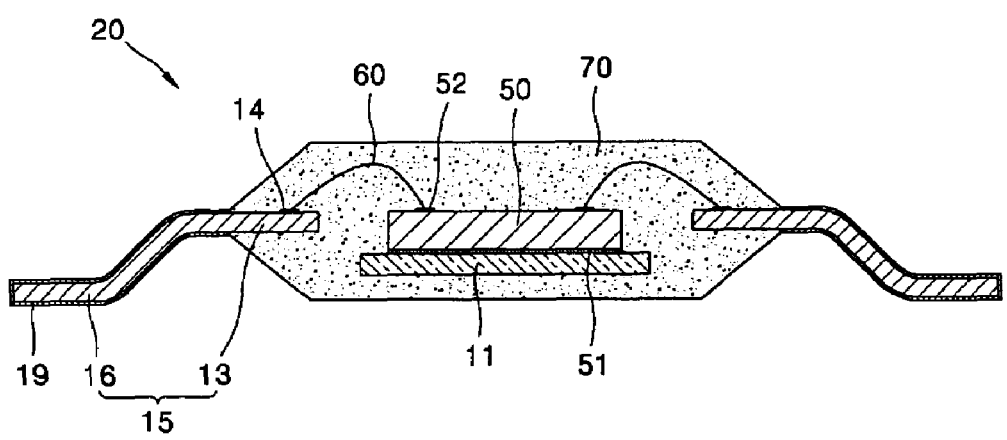
FIG. 2 is a cross-sectional view of a semiconductor package including the lead frame of FIG. 1.
Figure 3:
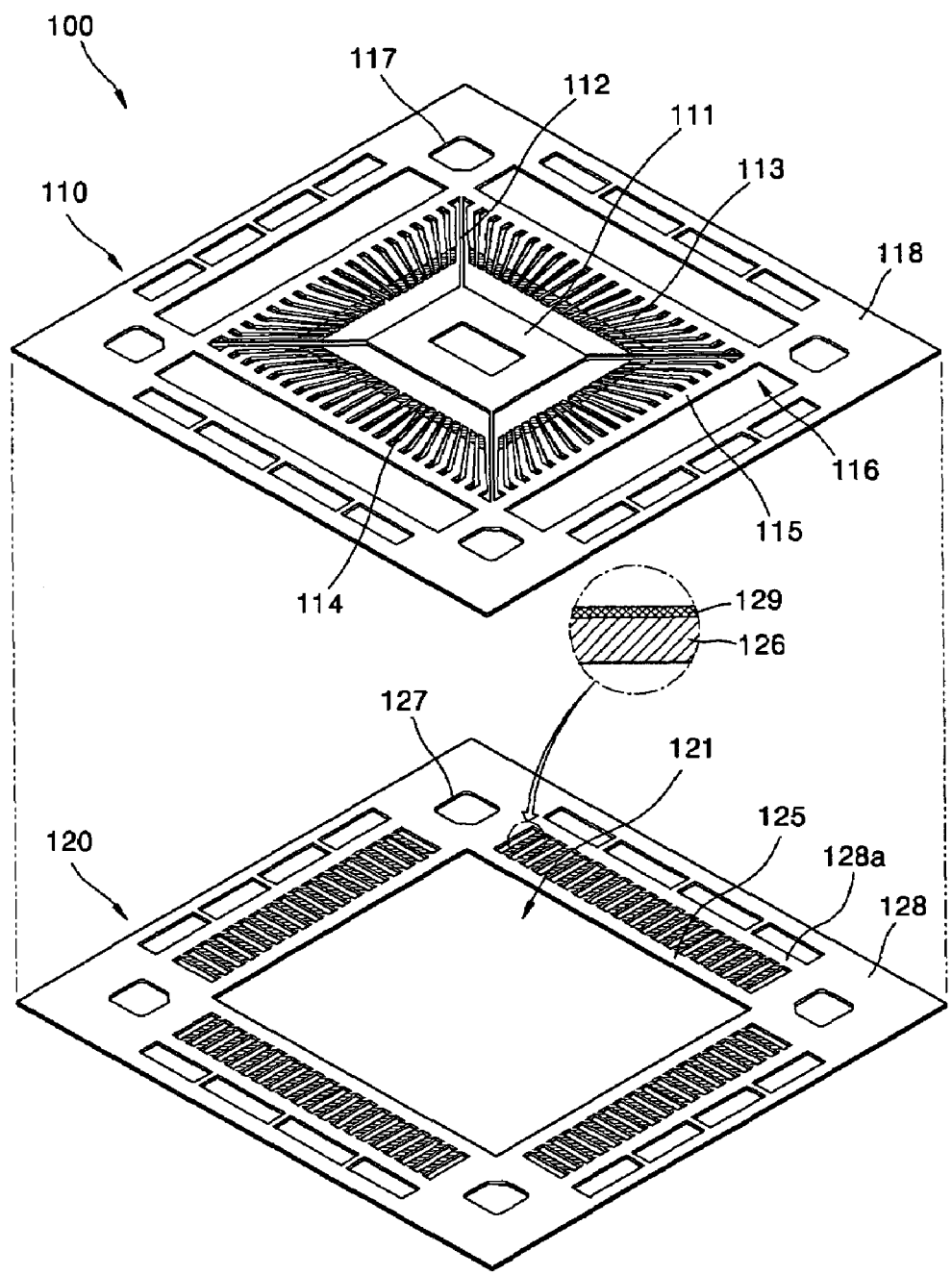
FIG. 3 is an exploded perspective view of a lead frame in a pre-assembled state and constructed according to one embodiment of the present invention.
Figure 4:
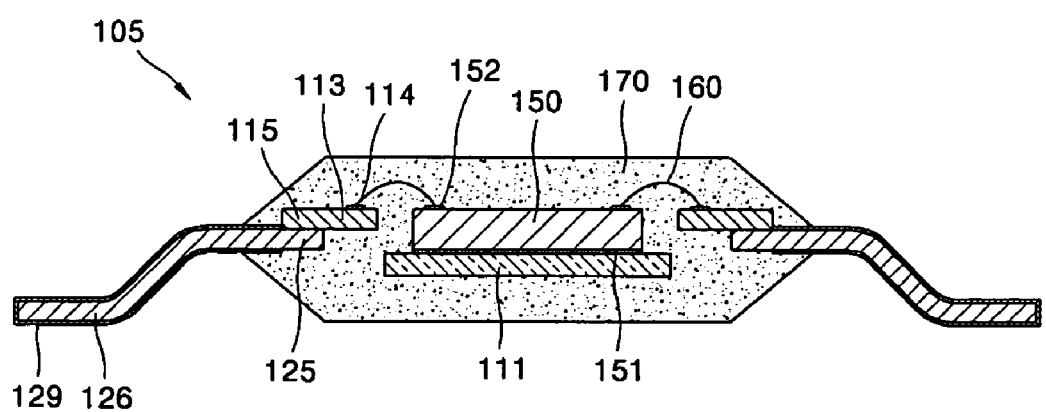
FIG. 4 is a cross-sectional view of a semiconductor package including the lead frame of FIG. 3.

FIG. 3 is an exploded perspective view of a lead frame constructed according to the present invention, and FIG. 4 is a cross-sectional view of a semiconductor package including the lead frame of FIG. 3. The lead frame shown in FIG. 3 is in a state before performing a coupling portion trimming process that will be described later, and the lead frame in the final form has a different shape with the two lead frames of FIG. 3 coupled with each other and some of the outer portions removed by the trimming process.

Referring to FIG. 3, a lead frame 100 includes a first lead frame 110 and a second lead frame 120 that are to be coupled or joined to each other in a face-to-face relation by a subsequent process as will be described later. The first lead frame 110 includes a first side rail (i.e., outer frame) 118 forming an outer boundary of the frame, a plurality of inner leads 113 extending generally inwardly (or radially) from the first side rail 118 at predetermined intervals, and a first coupling portion 115 connecting the inner leads 113 to each other at outer portion of the inner leads 113. In addition, outer penetration holes 116 are formed on the outer portion of the first coupling portion 115.

FIG. 4 illustrates an assembled state of a semiconductor device of the invention, in which each of the inner leads 113 is electrically connected to a bonding pad (electrode) 152 of the semiconductor chip 150 by a bonding wire 160. In this embodiment, a first plating layer 114 is formed on an inside area of the inner leads 113 to enhance the wire-bonding capacity for bonding with the wire 160 in the wire-bonding process. The first plating layer 114 is formed of a metal, such as Ag, Au, and Pd, having such a characteristic for facilitating the wire-bonding.

Referring to FIGS. 3 and 4, the first and second lead frames 110 and 120 can be coupled together in a manner such that the first coupling portion 115 of the first lead frame 110 joins with a second coupling portion 125 of the second lead frame 120. The first coupling portion 115 connects and supports the inner leads 113 and maintains the gaps between the inner leads 113. After coupling the first and second coupling portions 115 and 125, a predetermined area of the coupling portions 115 and 125 of the lead frame is to be cut in the coupling portion trimming process in order to separate each of the inner leads 113 as independent leads for the semiconductor device, which will be described herein after in further details.

The first lead frame 110 includes outer penetration holes 116 formed in a manner corresponding to the outer leads 126 of the second lead frame 120, thus the outer leads 126 are exposed from the upper portion of the lead frame through the outer penetration hole 116 after coupling the first and second lead frames 110 and 120. With the provision of the penetration holes 116, electric short-circuits between the outer leads 126 can be prevented.

The die pad 111 is connected to the side rail 118 by the tie bars 112, and supports the semiconductor chip thereon. As shown in FIG. 4, the semiconductor chip 150 is attached on the die pad 111 via an adhesive 151 on the lower surface thereof. The die pad 111 can be disposed on a plane that is lower than that of the inner leads 113 by a down-set process.

Referring to FIG. 3, guide holes 117 are formed at suitable corner areas of the side rail 118 to prevent a misalignment when the first and second lead frames 110 and 120 are coupled to each other. The first lead frame 110 can be formed typically by a stamping or etching method.

The second lead frame 120 includes a second side rail 128 forming an outer boundary of the second frame, a plurality of outer leads 126 formed integrally on the inside of the second side rail 128 at predetermined intervals, and second coupling portion 125 which connects the outer leads 126 to each other at the inside of the outer leads 126. In addition, an inner penetration hole 121 is formed on the inner portion of the second coupling portion 125.

An end portion of the each outer lead 126 is supported by the second coupling portion 125, and the other end portion is supported by the side rail 128, more specifically, by a supporting portion 128a of the side rail 128. As shown in FIG. 4, the outer leads 126 extend to the outside of the semiconductor package 105, and exposed portions of the outer leads are to be connected to the external circuit such as a circuit board. A second plating layer 129 is formed on the outer leads 126 exposed out of the semiconductor package 105. The second plating layer 129 is for enhancing the solder-wettability of the outer leads 126 during mounting of the semiconductor package on the circuit board, and also can reduce corrosions in the outer leads 126. The second plating layer 129 is generally formed of Sn or Sn alloy.

Referring again to FIG. 3, the second coupling portion 125 provides a surface for coupling with the first lead frame 110, and also supports the outer leads 126 to maintain the gaps between the outer leads 126. Predetermined areas of the second coupling portion 125 (along with the corresponding area in the first coupling portion 115) are cut in the coupling portion trimming process after the first and second lead frames 110 and 120 are coupled together.

The inner penetration hole 121 is formed in the central area including the area corresponding to the inner leads 113 of the first lead frame 110, thus the inner leads 113 can be exposed from the lower portion of the lead frame through the inner penetration hole 121 after the first and second lead frames 110 and 120 are connected together, and the electric shorts between the inner leads 113 can be prevented.

Guide holes 127 are formed on side areas of the second side rail 128 to align the first and second lead frames 110 and 120 for the connection and thus preventing a misalignment thereof.

As mentioned above, after the first lead frame 110 and the second lead frame 120 each fabricated in independent processes are coupled or connected to each other, predetermined areas of the first and second coupling portions 115 and 125 are removed through the coupling portion trimming process. The removing areas include the areas in the coupling portions 115 and 125 disposed between individual leads, as will be described in association with the coupling portion trimming operation (i.e., S43 in FIG. 9).

As shown in FIG. 4, which illustrates a semiconductor package having a lead frame of the invention in a final form, the die pad 111 is formed at the central portion, the inner leads 113 are formed around the die pad 111 and aligned toward the die pad 111, and the outer end portions of the inner leads 113 are connected with the inner end portions of the outer leads 126 while some portions in the coupling portions 115 and 125 (i.e., the portions remaining after the coupling portion trimming operation) are overlapping with each other as shown. Here, the outer leads 126 are directly supported by the supporting portion 128a that connects the outer leads 126 as a unit at the outer portion of the outer leads 126, and the inner leads 113 are supported by the outer leads 126. It is desirable that the coupling portions, on which the end portions of the inner leads 113 and the outer leads 126 are overlapped, are sealed by an encapsulation material (e.g., molding resin) in the subsequent semiconductor packaging process as shown in FIG. 4.

Figure 5:
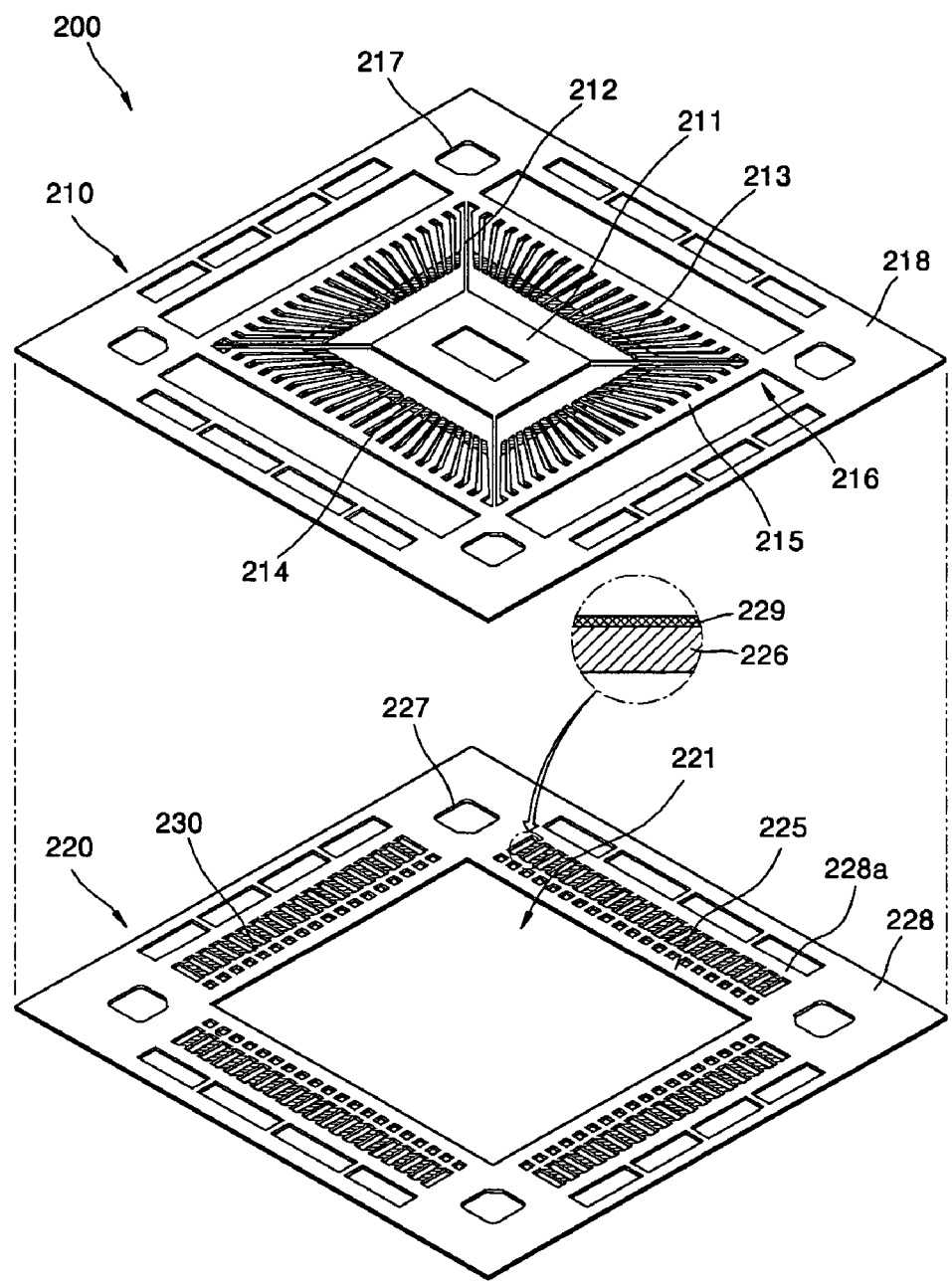
FIG. 5 is an exploded perspective view of a lead frame in a pre-assembled state and constructed according to another embodiment of the present invention.

FIG. 5 is an exploded (i.e., pre-assembled) perspective view of another embodiment of the lead frame according to the present invention. Referring to FIG. 5, the lead frame 200 includes a first lead frame 210 and a second lead frame 220 that are coupled to each other. For simplicity and clarity purposes, only the lead frame before performing the coupling portion trimming process is shown in FIG. 5.

A dam bar 230 that connects outer leads 226 to each other is formed between a second side rail 228 and a second coupling portion 225 of the second lead frame 220. The outer leads 226 can be secured as a unit by the dam bar 230 on the second lead frame 220, and a predetermined portion of the outer lead 226 is exposed to outside from the mold resin as described above.

As is similar to the lead frame of the first embodiment as described above, the lead frame 200 includes a die pad 211, tie bars 212, inner leads 213, a first plating layer 214, outer penetration holes 216, guide holes 217, a supporting portion 218a, and a first side rail 218, respectively in the first lead frame 210, and an inner penetration hole 221, guide holes 227, a supporting portion 228a, a second side rail 228, and a second plating layer 229, respectively in the second lead frame.

Figure 6:
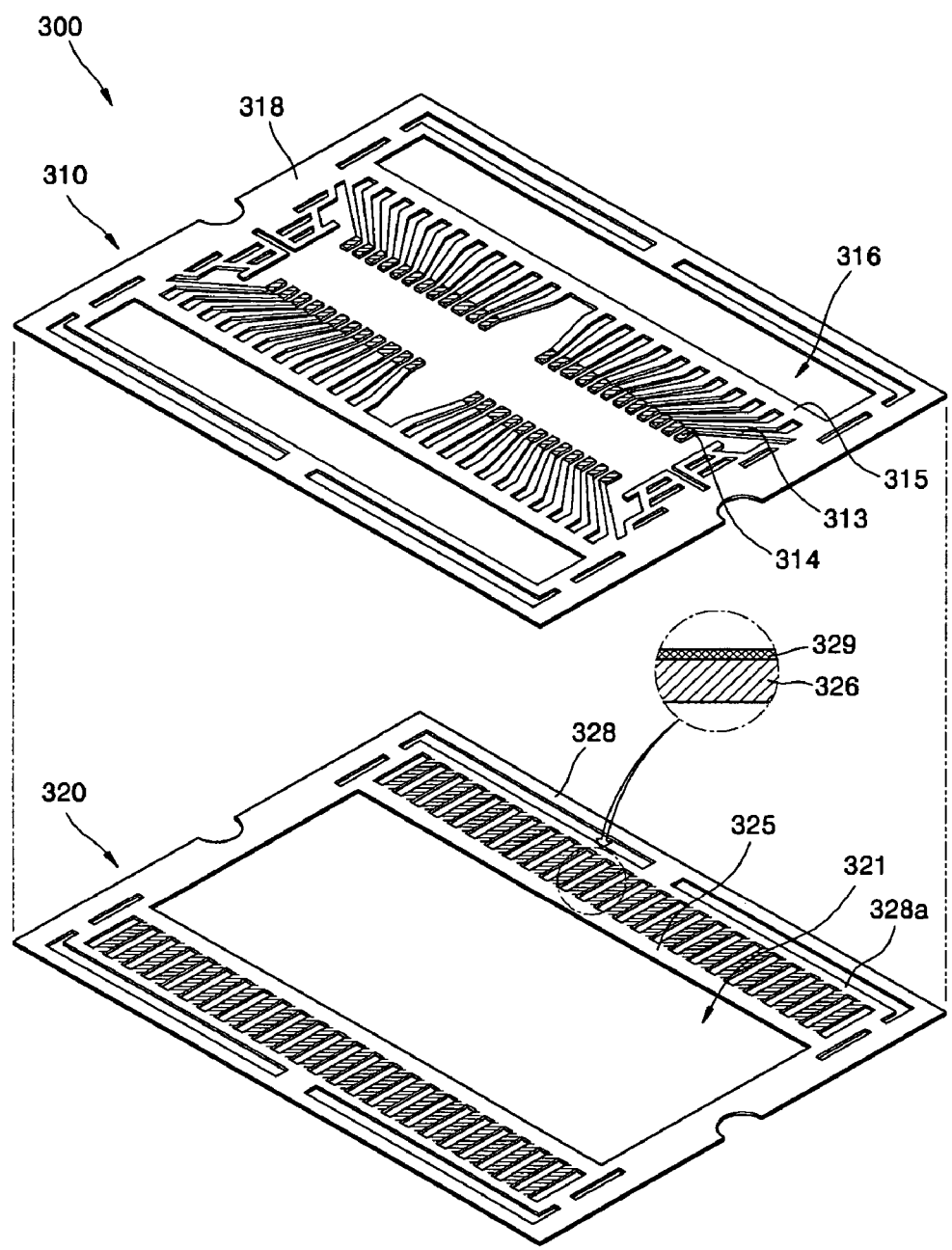
FIG. 6 is an exploded perspective view of a lead frame in a pre-assembled state and constructed according to a further embodiment of the present invention.
Figure 7:
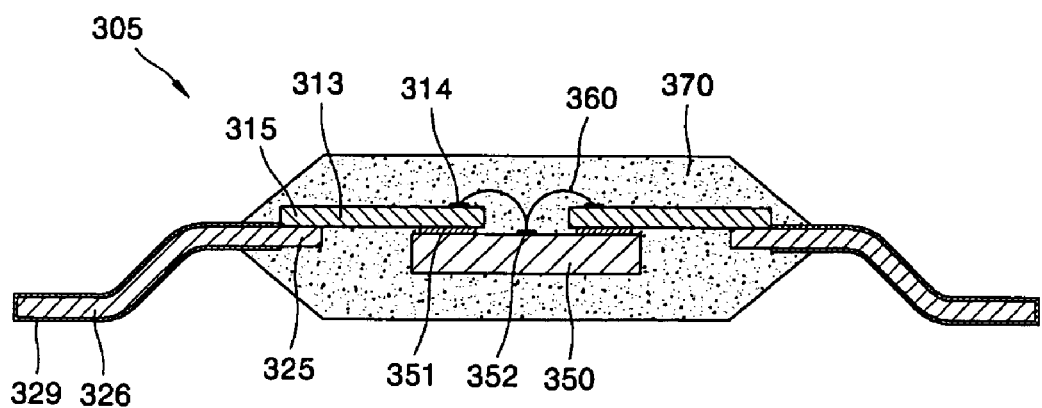
FIG. 7 is a cross-sectional view of a semiconductor package including the lead frame of FIG. 6.

FIG. 6 is an exploded perspective view of a lead on chip (LOC) type lead frame constructed according to the present invention, and FIG. 7 is a cross-sectional view of a semiconductor package including the lead frame shown in FIG. 6. The LOC type semiconductor package has a structure in which the semiconductor chip is located under the inner leads. In FIG. 6, only the lead frame before performing the coupling portion trimming process is shown for simplicity.

The lead frame 300 includes a first lead frame 310 and a second lead frame 320 that are coupled to each other in a face-to-face relation. The first lead frame 310 includes a first side rail 318 generally forming the outer boundary of the lead frame, inner leads 313 arranged inwardly from the inside of the side rail 318 and having predetermined intervals between the leads, and a first coupling portion 315 connecting the inner leads 313 at the outer portion of the inner leads 313. In addition, an outer penetration hole 316 is formed at the outer portion of the first coupling portion 315. The second lead frame 320 includes a second side rail 328, a plurality of outer leads 326 supported by a supporting portion 328a of the second side rail 328, and a second coupling portion 325 connecting the outer leads 326 to one another at the inner portion of the outer leads 326. In addition, an inner penetration hole 321 is formed at the inner portion of the second coupling portion 325. The first and second lead frames 310 and 320 are coupled or joined to each other by connecting the first coupling portion 315 and second coupling portion 325 together, and the inner leads 313 of the first lead frame 310 and the outer leads 326 of the second lead frame 320 are exposed to the outside of the lead frame 300, respectively, through the inner penetration hole 321 of the second lead frame 320 and the outer penetration holes 316 of the first lead frame 310.

FIG. 7 shows a semiconductor package structure including the lead frame of FIG. 6. Referring to FIG. 7, the semiconductor chip 350 is attached on a lower surface of the inner leads 313 by an adhesive material, such as an adhesive tape 351 attached onto the lower surface of the inner leads 313, and a bonding pad (electrode) 352 formed on the central portion of the semiconductor chip 350 is electrically connected to the end portions of the inner leads 313 by a bonding wire 360. Here, a first plating layer 314 is formed on the end portion of each inner lead 313, and a second plating layer 329 is formed on each outer lead 326 that is exposed to the outside of the semiconductor package 350. Reference numeral 370 denotes a mold resin that seals the semiconductor chip 350, the first coupling portion 315, and the second coupling portion 325, respectively.

Figure 8:
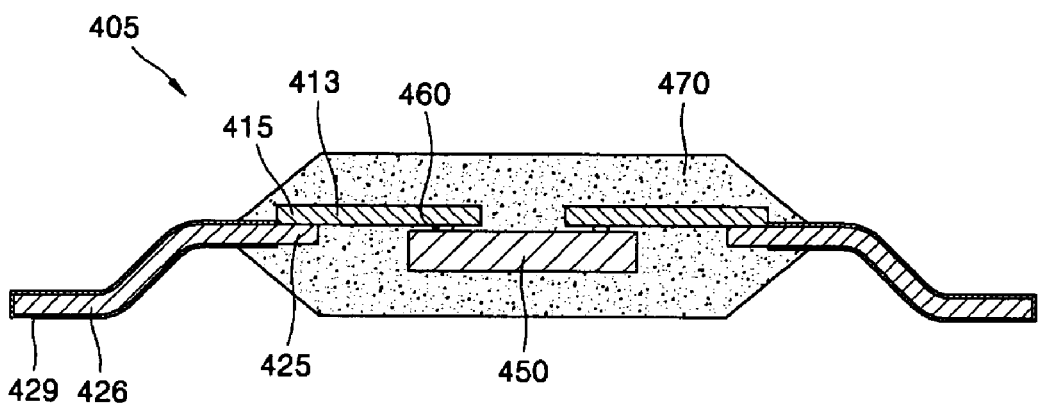
FIG. 8 is a cross-sectional view of a semiconductor package similar to that of FIG. 7 and including a lead frame constructed according to still a further embodiment of the present invention.

FIG. 8 shows a semiconductor package structure including a lead frame of the invention, constructed according to another embodiment of the invention. Similar to the lead frame as shown in FIG. 6, this lead frame also includes inner leads 413 and outer leads 426, and the inner leads 413 and the outer leads 426 are also connected to each other via coupling portions 415 and 425. In addition, a second plating layer 429 is formed on the outer leads 426 which are exposed out of the semiconductor package 405. However, in this embodiment, the semiconductor chip 450 is electrically connected to the inner leads 413 by conductive bumps 460 formed on the bonding pads. Here, because the semiconductor chip 450 is directly connected to the inner leads 413 by the conductive bumps 460, there is no need to form the first plating layer on the end portions of the inner leads 413 as the prior embodiments described above. Reference numeral 470 denotes a mold resin that seals the semiconductor chip 450, the first coupling portion 415, and the second coupling portion 425, respectively.

Figure 9:
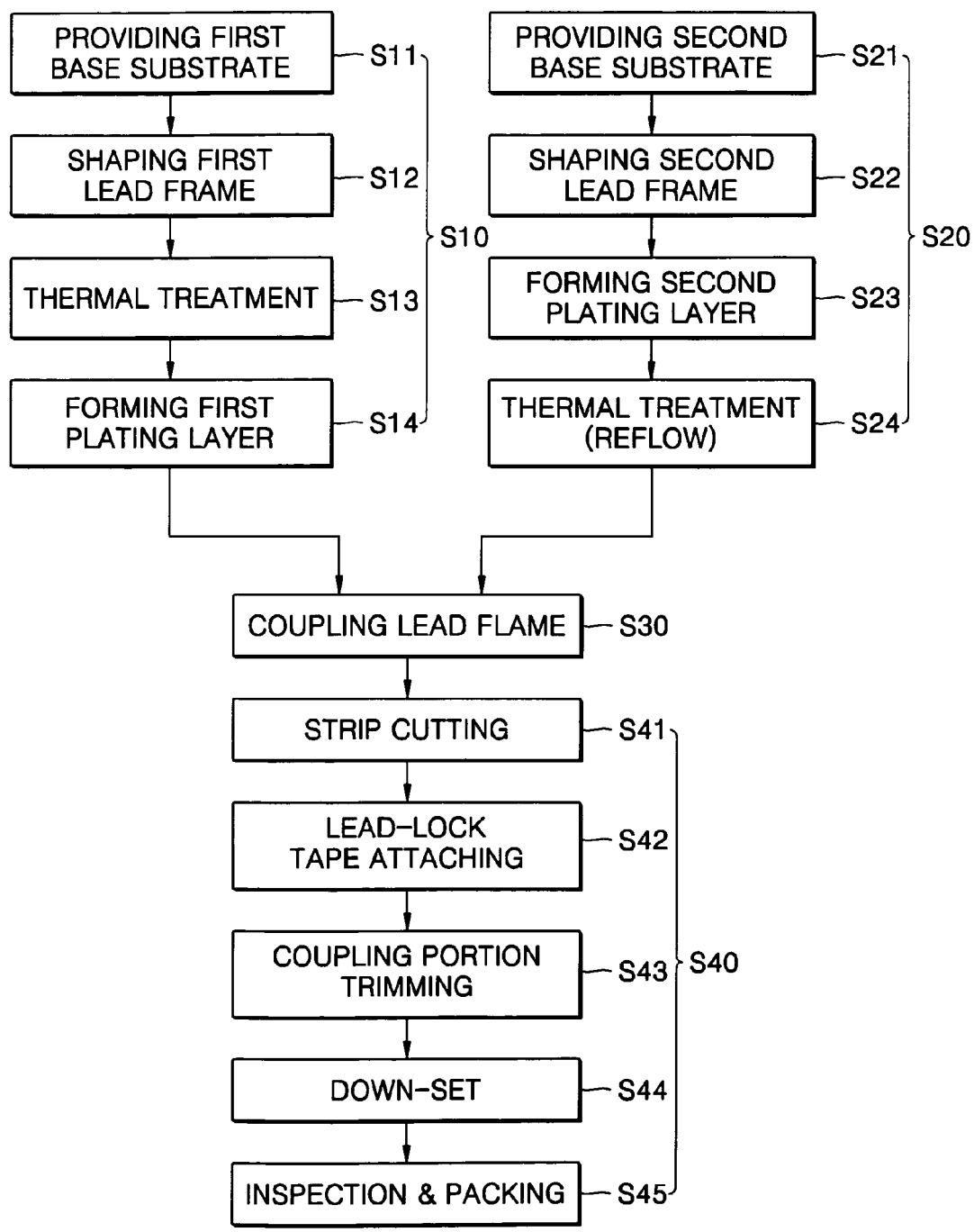
FIG. 9 is a flow chart of a method for manufacturing a lead frame according to one preferred embodiment of the present invention.

Hereinafter, a method of manufacturing the lead frame according to the present invention is described with reference to FIG. 9.

According to one preferred method of the invention, a process of forming the first lead frame (S10) and a process of forming the second lead frame (S20) can be performed simultaneously or at least in a non-serial manner, and the fabricated first and second lead frames are coupled as one lead frame through a lead frame coupling process (S30). After that, a post-coupling process (S40) is performed.

The process of forming the first lead frame (S10) typically includes the operations of preparing (or providing) a first base substrate (S11), shaping the first base substrate into a designed shape (S12), performing a thermal treatment (S13), and forming the first plating layer (S14).

An elongate base lead frame strip is first formed of a suitable lead-frame material known in the art, for example, of a metal alloy composed of Fe and Ni. In the operation of shaping (or forming) the first base substrate (S12), a plurality of inner leads, outer penetration holes, and a first coupling portion such as described above are integrally formed on the base substrate according to the particular design of the lead frame. Here, a die pad, tie-bars, dam-bars, or the like known in the art can also be formed in the first lead frame depending on the particular design of the lead frame. This shaping process can be performed typically by a stamping method or an etching method. When using the stamping method, the base substrate (in the form of elongate strip) is sequentially moved on a progressive-moving type pressing machine (e.g., a progressive punching machine), and a plurality of holes corresponding to the shape of the lead frame are formed progressively in the base strip by the punching machine. When using the etching method, a photosensitive layer is applied on the base substrate, and suitable light rays are radiated onto the substrate through a photo mask having a predetermined pattern, and then, the substrate is subject to a development process to form the predetermined patterns on the base substrate.

After performing the operation S12, the substrate is optionally subject to a thermal treatment (S13) for removing residual stresses in the first lead frame, if necessary. In the operation S14, the first plating layer, such as an Ag, Au, or Pd layer is formed on an upper tip portion of the inner leads. By forming the first plating layer, the bonding wire can be readily attached on the inner leads.

The operation of forming the second lead frame (S20) includes the operations of preparing a second base substrate (S21), shaping the second base substrate (S22) into a designed configuration, forming a second plating layer (S23), and performing a thermal treatment (S24). In the operation S21, the second base substrate for producing the second lead frame is provided. The base substrate is typically in the form of an elongate strip for producing a plurality of lead frames from the strip. As is the first lead frame, this second lead frame can also be formed of suitable materials for forming the lead frame, such as an alloy of Fe and Ni. In the operation S22, a plurality of outer leads, an inner penetration hole, and a second coupling portion are integrally formed on the second base substrate using the stamping method or the etching method as described above.

Next, in the operation S23, the second plating layer is formed on the outer leads. The second plating layer is formed preferably of Sn or alloy of Sn. Therefore, the soldering characteristic of the outer leads can be improved, and the semiconductor package can be easily attached on the circuit board with strong bond. In addition, the corrosion resistance property of the outer leads that are exposed out of the semiconductor package can be improved.

After performing the operation S23, the thermal treatment process (S24) such as a reflow process is performed. Here, the second plating layer is heated at a temperature higher than a re-crystallization temperature in order to restrict the growth of whiskers in the second plating layer formed typically of Sn or Sn alloy, in particular. The operation S24 can be performed in the conventional reflow methods known in the art.

Figure 10:
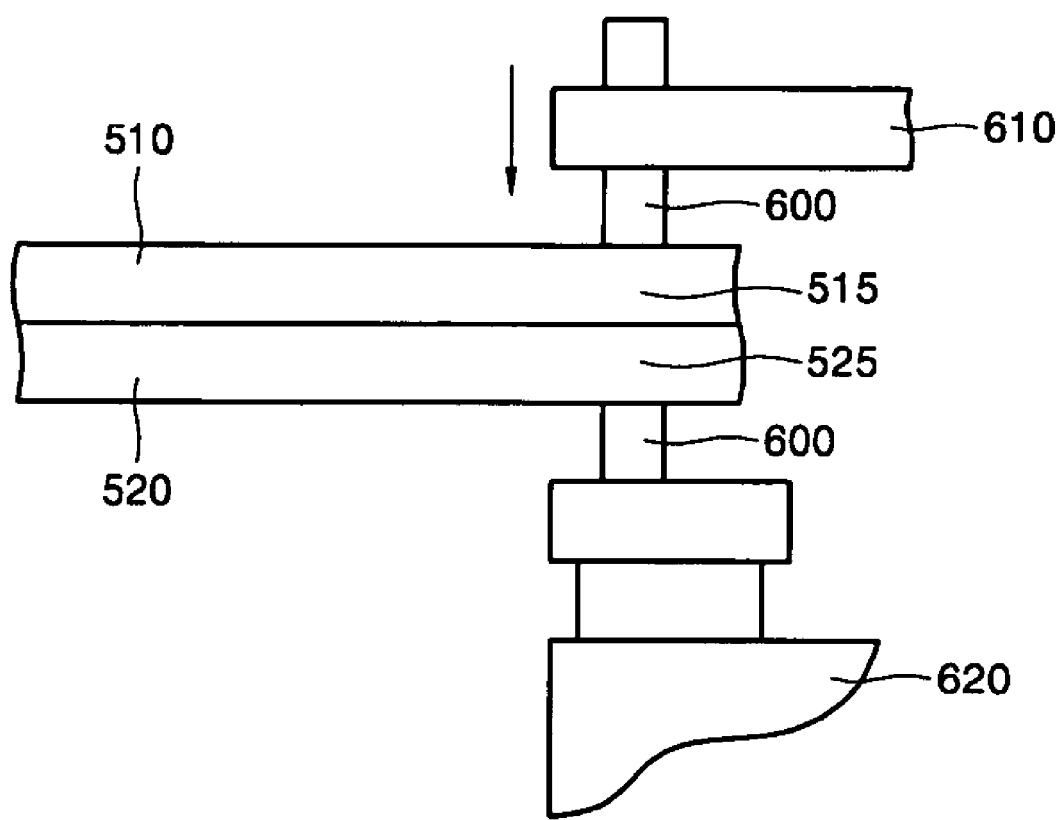
FIG. 10 is a schematic view illustrating the lead frame coupling process according to one embodiment of the invention.

Now, after providing the first and second lead frames, the operation of coupling lead frame (S30) is performed. Here, the coupling of the first and second lead frames can be performed by known coupling or joining methods, for example, by a spot welding method, metal bonding method, or other electric resistance welding methods. That is, referring to FIG. 10, the first lead frame 510 and the second lead frame 520 are overlapped in a manner described above and positioned between welding electrodes 600 as shown, and an electrode supporting bar 610 of the upper electrode 600 is pressed toward a lower electrode supporting board 620 to connect the first and second coupling portions 515 and 525 together while applying suitable electric currents. The first and the second lead frames can be joined together by various other bonding technologies such as a laser welding method or the like.

After coupling the first and second lead frames, the post-coupling process S40 is performed. The post-coupling process S40 can include a strip cutting operation (S41), a lead-lock tape attaching operation (S42), a coupling portion trimming operation (S43), a down-set operation (S44), and an inspection and packing operation (S45).

Figure 11:
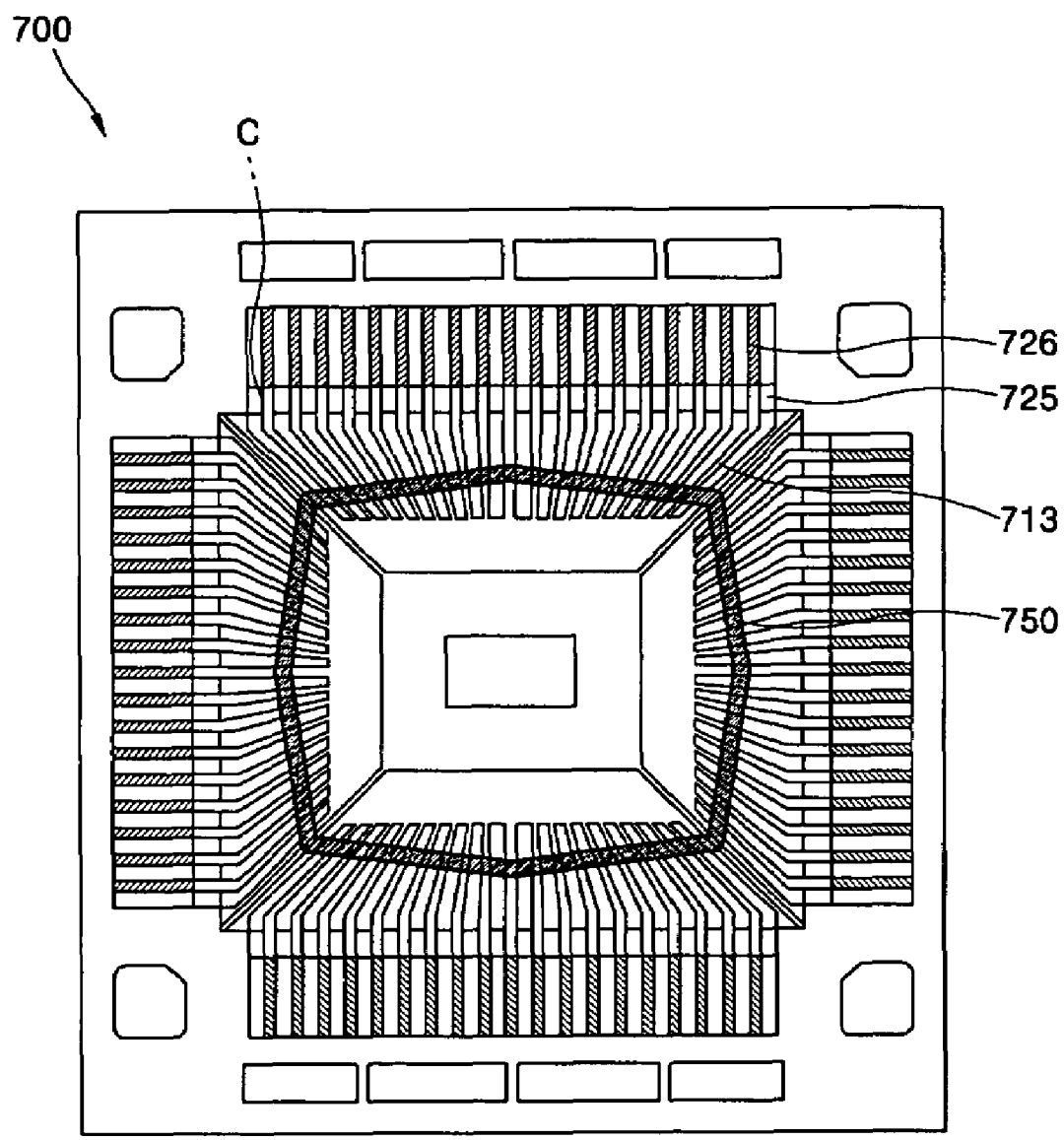
FIG. 11 is a plan view of a lead frame constructed according to one embodiment of the invention.

In the strip cutting operation S41, the elongate lead frame strip is cut into a plurality of unit lead frames. Next, in the lead-lock tape attaching operation S42, a lead-lock tape 750 is attached on a surface of the inner leads 713 around the circumference of the inner leads to securely support the inner leads 713, as shown in FIG. 11, for example. Even when a predetermined portion of the coupling portion is removed by the subsequent coupling portion trimming operation S43, the inner leads 713 can be secured by the lead-lock tape 750 without deformation, while maintaining the designed intervals of the leads.

Referring to FIG. 11, in the coupling portion trimming operation S43, predetermined portions of the coupling portion 725 (that is, the portions where the first and second coupling portions of the first and second lead frame are connected) are removed to separate each lead from its neighbouring leads. Here, a plurality of connection portions (in the coupling portion 725) disposed between two neighbouring leads are cut along cutting lines C, thus providing a plurality of separate leads with the ends of the inner and outer leads 713 and 726 overlapping (as shown in FIGS. 4, 7 and 8). As such, when the coupling portion 725 is cut along the cutting lines C, each of the unit lead (with each inner lead 713 and each outer lead 726 connected) is physically separated from its neighbouring leads, and thus is usable as a terminal for the semiconductor device.

More specifically, in the coupling portion trimming operation S43, the lead frame is typically positioned between an upper punching die and a lower die having suitable configurations, and the upper die is compressed to punch the lead frame at the coupling portion 725 of the lead frame. It is desirable that certain cavities (not shown) connecting the terminal ends of the inner leads 713 are also cut in this process. The particular cutting positions can be modified by changing the shape of the punch in the upper die. The cutting operation can be performed preferably by a single punching stroke.

In the down-set operation S44, the tie bars connecting the die pad to the side rail is down-set to dispose the die pad at a plane that is lower than that of the inner leads. Then, the inspection process and packing process S45 are performed, which completes the manufacturing process of the lead frame of the invention.

After the lead frame is produced, it now subjects to a semiconductor packaging process to produce a semiconductor device such as described above in connection with FIGS. 4, 7 and 8, in which the packaging process typically includes a die-bonding process for mounting a semiconductor chip on the die pad, a wire-bonding process for electrically connecting the semiconductor chip with the inner leads of the lead frame, and an encapsulation process for covering the designed area of the semiconductor chip and the lead frame with an encapsulating material such as a resin mold. These packaging processes are described above, and conventional methods known in the semiconductor manufacturing field can be applied.

After the semiconductor package is produced as described above, the semiconductor device is now subject to a further trimming process to remove some of the structural elements of the lead frame (such as 100, 200 and 300 in FIGS. 3, 5 and 6) that are not necessary for the ultimate semiconductor device. For example, supporting portions (such as 128*a*, 228*a* and 328*a* in FIGS. 3, 5 and 6) are only necessary to secure the lead frame in shape during the manufacturing process of the semiconductor device, and are removed typically by stamping, punching, etching, or other known cutting methods. The resultant semiconductor has a plurality of outer leads (such as 126, 226 and 326 in FIGS. 3, 5 and 6) that are separated from one another for functioning as multiple terminals for the semiconductor device.

As described above, according to the conventional art, after forming the pattern of the lead frame, the process of forming the first plating layer (e.g., Ag plating layer) on the inner area of the inner leads, and the process of forming Sn plating layer on the outer leads should be performed sequentially. However, according to the present invention, the first lead frame having the inner leads and the second lead frame having the outer leads are fabricated separately, preferably in simultaneous or parallel forming processes (e.g., S10 and S20). Thus, when the first and second lead frames are formed simultaneously, the total processing time can be reduced substantially. That is, during forming the first plating layer by the first lead frame forming operation S10, the second plating layer can be formed simultaneously by the second lead frame forming operation S20.

Generally, the reflow process is performed in order to restrain a whisker generation in the Sn plating layer disposed on the outer leads. In the conventional art, where the inner leads and the outer leads are formed in a single sheet of lead frame, the first plating layer (e.g., Ag layer) formed on the inner leads can be affected or disordered by the reflow process. Thus, because the first plating layer is disordered by the reflow process, the wire-bonding capability of the inner leads becomes degraded. However, according to the present invention, the first lead frame having the inner leads and the second lead frame having the outer leads are subject to different processes from each other, thus the above problem of the conventional art can be solved effectively.

In addition, utilizing the lead frame of the invention which is formed by coupling two (i.e., first and second) lead frames together, the strength of the lead frame can be improved because the coupling portion has a dual-layered (overlapped) structure. Therefore, deformation and vibration of the lead frame in the post-coupling process S40 can be reduced.

The present invention is not limited to the particular structures of the lead frame and/or the semiconductor devices as shown in the accompanying drawings, but it can be applied to any lead frames and/or semiconductor devices having different structures, formats or configurations.

According to the lead frame and the method of manufacturing the lead frame and the semiconductor device of the present invention, the yield of production can be improved because the total processing time is reduced. In the present invention, since the first lead frame having the inner leads and the second lead frame having the outer leads are separately fabricated in different forming processes, the plating layer forming operations of the two lead frames can be performed at the same time. Therefore, the processing time can be reduced greatly.

In addition, since the processes of forming the first and second lead frames are separately performed, the conventional degradation problems causable from a sequential production of the lead frame can be reduced substantially. In particular, while in the conventional art the first plating layer can be degraded or damaged by the reflow process performed after forming the Sn plating layer, this thermal damage problem can be prevented according to the present invention as described above.

Moreover, having the coupling portion in dual-layered structure, the strength and rigidity of the lead frame is increased, and the deformation and vibration of the lead frame can be effectively prevented, which make it easy to handle the lead frame in the post-coupling process.

While the present invention has been particularly illustrated and described with reference to exemplary embodiments thereof, it will be understood by those of ordinary skill in the art that various changes in form and details may be made therein without departing from the spirit and scope of the present invention as defined by the following claims.

What is claimed is:

1. A lead frame for a semiconductor device comprising:
a plurality of inner leads formed from a first lead frame and arranged in an inward direction of the lead frame with predetermined intervals between them; and
a plurality of outer leads formed from a second lead frame, the second lead frame having separate existence from the first lead frame, each of the outer leads arranged in a manner extending outwardly from a corresponding one of the inner leads, each of the outer leads having an inner end overlapped and connected with the corresponding one of the inner leads and an outer end connected to a supporting portion disposed at an outer area of the outer leads.

2. The lead frame of claim 1, further comprising a dam bar formed along the outer leads in a transverse direction thereof and connecting the outer leads to one another.

3. The lead frame of claim 1, further comprising a die pad disposed at an inward location from the inner leads.

4. The lead frame of claim 1, wherein the inner leads including a first plating layer formed on an inner surface of the inner leads, the first plating layer containing at least one material selected from a group consisting of Ag, Au and Pd.

5. The lead frame of claim 4, wherein the outer leads including a second plating layer formed thereon, the second plating layer containing Sn as a main material.

6. The lead frame of claim 1, wherein the overlapped portions of the inner leads and the outer leads are connected together by welding or bonding.

7. A semiconductor device comprising:
a lead frame, the lead frame including a plurality of inner leads formed from a first lead frame and arranged in an inward direction of the lead frame, and a plurality of outer leads formed from a second lead frame, the second lead frame having separate existence from the first lead frame, each of the outer leads arranged in a manner extending outwardly from a corresponding one of the inner leads, each of the outer leads having one end portion overlapped and connected with the corresponding one of the inner leads;
a semiconductor chip disposed adjacent to a central location of the lead frame in a manner supported by the lead frame; and
an encapsulation material covering at least some portions of the semiconductor chip and the lead frame including the overlapped portion of the inner and outer leads.

8. The semiconductor device of claim 7, wherein at least some portion of the inner leads of the lead frame is plated with a material enhancing wire-bonding capacity, and at least some portion of the outer leads of the lead frame is plated with a material enhancing solder-wettability.

9. The semiconductor device of claim 8, wherein the material plated on the inner leads of the lead frame is a material containing at least one of Au, Ag and Pd.

10. The semiconductor device of claim 8, wherein the material plated on the outer leads of the lead frame is a material containing Sn.

11. The semiconductor device of claim 7, wherein the lead frame further includes a die pad disposed adjacent to a central location of the lead frame, and the semiconductor chip is positioned on the die pad.

12. The semiconductor device of claim 11, wherein the lead frame further includes tie-bars for securing the die pad to the lead frame.

13. The semiconductor device of claim 7, wherein the semiconductor chip is attached to the lower surface of the inner leads.

14. The semiconductor device of claim 13, wherein the semiconductor chip is attached to the lower surface of the inner leads with conductive bumps disposed there-between.

* * * * *